United States Patent
Miyamoto

(10) Patent No.: US 6,599,770 B2
(45) Date of Patent: Jul. 29, 2003

(54) PROCESS FOR MANUFACTURING AN OPTICAL DEVICE

(75) Inventor: Akihiro Miyamoto, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/981,128

(22) Filed: Oct. 17, 2001

(65) Prior Publication Data

US 2002/0047190 A1 Apr. 25, 2002

(30) Foreign Application Priority Data

Oct. 19, 2000 (JP) .................................. 2000-319901

(51) Int. Cl.[7] .............................................. H01L 21/00
(52) U.S. Cl. ........................... 438/48; 438/65; 438/116; 438/123
(58) Field of Search .................. 257/431, 432, 257/433, 434, 670, 672, 676, 680, 704; 438/48, 54, 55, 65, 69, 116, 123, 124, 125

(56) References Cited

U.S. PATENT DOCUMENTS 5,200,367 A * 4/1993 Ko .............................. 29/827
5,616,949 A * 4/1997 Watanabe .................. 257/434
6,403,881 B1 * 6/2002 Hughes ...................... 174/52.3
6,417,552 B1 * 7/2002 Van Arendonk ............ 257/431

* cited by examiner

*Primary Examiner*—Wael Fahmy
*Assistant Examiner*—Hoai Pham
(74) *Attorney, Agent, or Firm*—Paul & Paul

(57) ABSTRACT

An optical device includes a package consisting of a lead frame and a molded resin integrally molded with the lead frame. The package has a cavity in which an optical element is installed. The opening of the cavity is closed by a cap defining a light transmission window. An ultraviolet-light-setting type adhesive is used to fix the cap to the package so as to close the opening of the cavity. When fixing the cap to the package, a ultraviolet-tray is irradiated toward an adhesion area between the cap and the package to solidify the ultraviolet-light-setting type adhesive to fix the cap to the package. The cap is provided with a UV light impermeable, protective film except for a peripheral area thereof and the cap is fixed to the package in such a manner the UV light impermeable, protective film faces outside of the cavity.

3 Claims, 4 Drawing Sheets

PROCESS FOR MANUFACTURING AN OPTICAL DEVICE

BACKGROUND OF THE INVENTION

1. Field of the Invention

The present invention relates to an optical device, using a lead frame, on which an optical element such as an image sensor is mounted. The present invention also relates to a process for manufacturing such an optical device.

2. Description of the Related Art

Concerning the optical device on which an optical element such as an image sensor is mounted, there has been proposed, in the prior art, a product, such as that shown in FIG. 5, in which the optical element 12 is mounted on the package body 10, which is formed by resin molding, and the package body 10 is sealed by a light transmitting cap 14. The optical device shown in FIG. 5 is a product in which the light transmitting cap 14, which is formed in such a manner that a light transmitting window 16, composed of a glass sheet and made to adhere to the frame 15 formed by resin molding, is fixed to the package body 10.

The above-mentioned optical device conventionally known in the prior art is manufactured as follows. First, the package body 10 is formed on the lead frame 20 by means of resin molding, in which a metallic mold for resin molding is used. Next, the optical element 12 is made to adhere onto the package body 10, and the optical element 12 and the inner leads 20a of the lead frame 20 are electrically connected with each other by wire bonding. Then, the light transmitting cap 14 is fixed onto the opening of the package body 10. Finally, the outer lead 20b is formed by a trimming and forming process. After that, the individual optical device is separated from the lead frame 20. In this way, an optical device can be obtained.

In the manufacturing process of the above optical device, the package body 10 is sealed when the light transmitting cap 14 is made to adhere onto the opening of the package body 10. Concerning the adhesive used for the adhesion of the light transmitting cap 14, a thermosetting adhesive is conventionally used. In this case, the thermosetting adhesive is conventionally used for the object of ensuring the heat resistance and reliability so that the sealing property of the package cannot be impaired even if heat is given to it in the process of mounting the optical device. Since the thermosetting adhesive is used for the adhesion of the light transmitting cap 14 as described above, the thermosetting adhesive is coated on the package body 10 and the package is heated under the condition the light transmitting cap 14 is attached to the package body 10 so that the thermosetting adhesive is cured by heating the package in the conventional manufacturing process.

In this adhesion process in which the light transmitting cap 14 is made to adhere onto the package body 10, a workpiece is put into a heating furnace and heated at about 100° C. for about 1 hour, and then the heating temperature is further raised to 170 to 180° C. and kept at this temperature for about 1 hour so that the adhesive can be cured, and then the temperature is gradually lowered to room temperature. This adhesion process requires about half a day. As described above, according to the conventional manufacturing process, the process in which the light transmitting cap 14 is made to adhere onto the package body 10 requires a long period of time. Further, this adhesion process is conducted by batch processing. From the viewpoint of using batch processing, the working efficiency is low.

In addition, when the package is heated in the adhesion of the light transmitting cap 14, gas is emitted from the thermosetting adhesive, which causes the following problems. The light transmitting cap 14 may be raised from the package body 10 by the pressure of gas emitted from the inside of the package body 10. In order to solve the above problems, in the conventional manufacturing process, heating is conducted while the light transmitting cap 14 is being held by a clip jig so that the light transmitting cap 14 cannot be raised from the package body 10 when the light transmitting cap 14 is made to adhere to the package body 10. As described above, according to the conventional manufacturing method, the manufacturing work must be conducted in such a manner that the clip jig for preventing the light transmitting cap 14 from rising is provided, and after the completion of heating, the clip jig must be removed. From this point of view, the working efficiency is lowered.

SUMMARY OF THE INVENTION

The present invention has been accomplished to solve the above problems. It is an object of the present invention to provide an optical device, using a lead frame, in which the light transmitting cap can be easily and efficiently fixed to the package body, so that the optical device can be easily mass-produced.

It is another object of the present invention to provide a process for manufacturing such an optical device.

In order to accomplish the above objects, the present invention is provided with the following structure.

According to the present invention, there is provided an optical device comprising: a package consisting of a lead frame and a molded resin integrally molded with the lead frame, the package being provided with a cavity having an opening; an optical element installed in the cavity of the package; a cap defining a light transmission window for closing the opening of the cavity; and an ultraviolet-light-setting type adhesive for fixing the cap to the package so as to close the opening of the cavity.

The optical device further comprises a UV light impermeable, protective film attached to a surface of the cap, facing outside with respect to the cavity, except for an outer peripheral area of the cap, which is exposed from the protective film.

The lead frame comprises a stage exposed on a bottom surface of the cavity and a plurality of leads, each lead having an inner lead exposed on the bottom surface of the cavity and arranged around the stage and an outer lead extending outward from the molded resin of the package; and the optical element is mounted on the stage.

The cavity having the opening is substantially rectangular and the opening is provided with a step along the an inner periphery thereof so that an outer peripheral edge of the cap is engaged with the step.

According to another aspect of the present invention, there is provided a process for manufacturing an optical device comprising the following steps of: preparing a package consisting of a lead frame and a molded resin integrally molded with the lead frame, the package being provided with a cavity having an opening; installing an optical element in the cavity of the package; coating an ultraviolet-light-setting type adhesive along a periphery of the opening of the package; applying a cap for defining a light transmission window to the package so as to close the opening of the cavity; and irradiating ultraviolet-light toward an adhesion area between the cap and the package to solidify the ultraviolet-light-setting type adhesive to fix the cap to the package.

The cap is provided with a UV light impermeable, protective film attached to one surface of the cap and the cap is applied to the package in such a manner that the UV light impermeable, protective film faces the outside of the cavity.

The UV light impermeable, protective film is attached in advance to the one surface of the cap except for an outer peripheral area of the cap, which is exposed from the protective film.

The optical element is installed in the cavity so that the optical element is mounted on the stage; and the optical element is electrically connected to the inner leads, before the cap is applied to the package.

DETAILED DESCRIPTION OF THE PREFERRED EMBODIMENTS

Referring to the accompanying drawings, a preferred embodiment of the present invention will be explained, in detail, as follows.

Figure 1A:
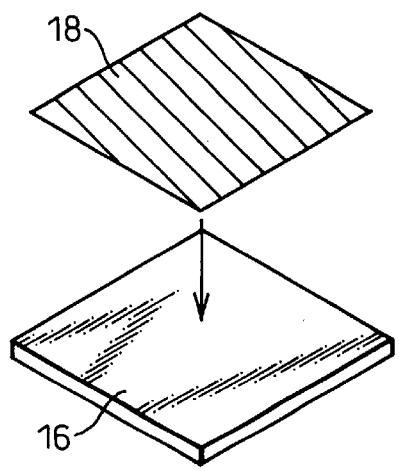
FIG. 1(a) is a view showing a process in which a protective film is made to adhere to a light transmission window.
Figure 1B:
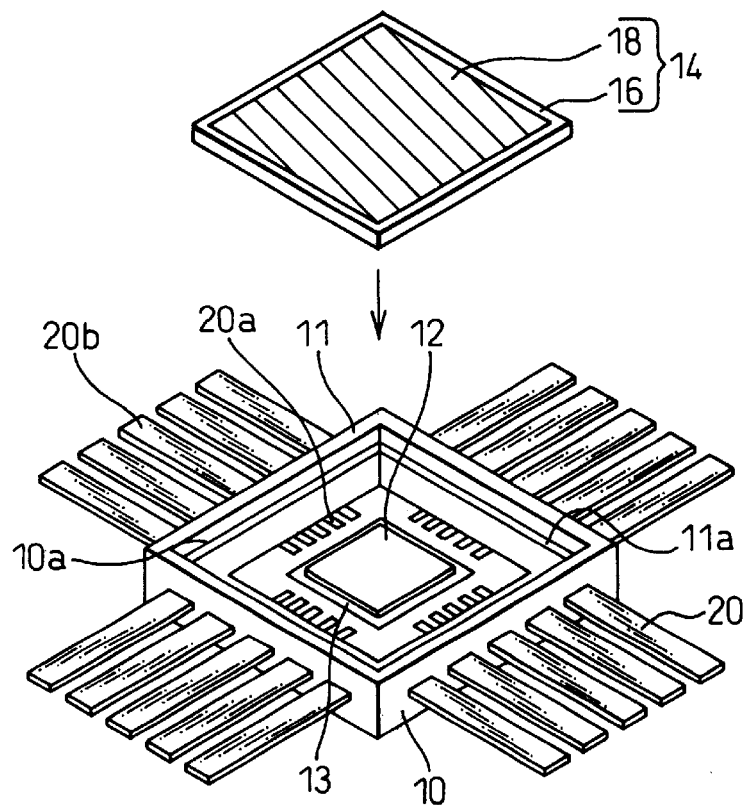
FIG. 1(b) is a view showing a process in which a light transmitting cap is attached to a package.
Figure 2:
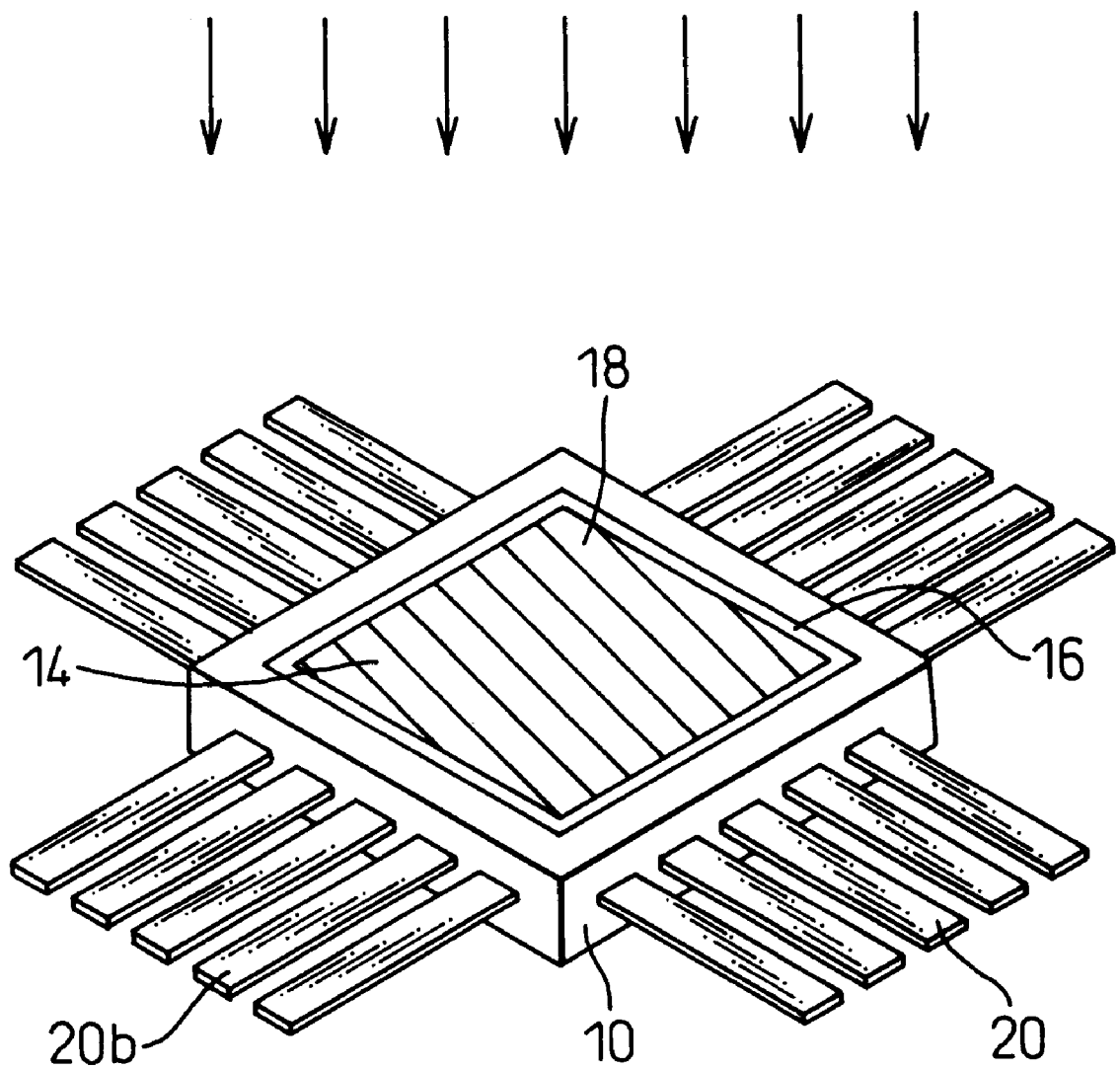
FIG. 2 is a schematic illustration showing a state in which the light transmitting cap is made to adhere to a package body by irradiating ultraviolet rays to the light transmission window.
Figure 3:
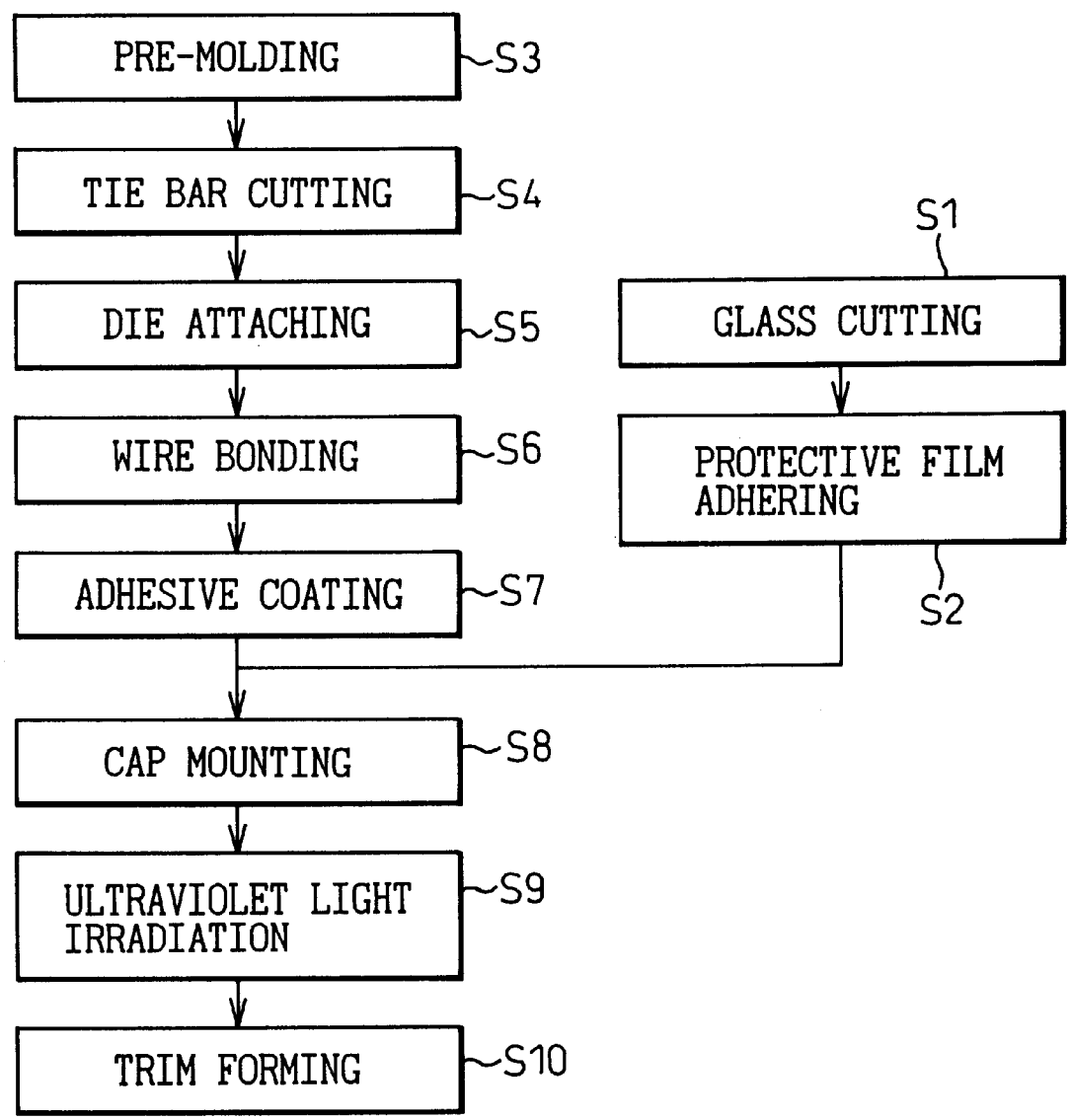
FIG. 3 is a flow chart showing a manufacturing process of an optical device.

FIGS. 1(a), 1(b) and 2 are schematic illustrations showing an embodiment of a process of manufacturing an optical device. FIG. 3 is a flow chart showing a manufacturing process of the optical device.

The optical device of this embodiment is manufactured by using a light transmission window composed of a glass pane which is used as a light transmitting cap fixed to a package body. FIG. 1(a) is a view showing a process in which the light transmission window 16 is formed by cutting a glass sheet, such as having a thickness of 0.6 to 0.7 mm, into a predetermined size and shape, such as a rectangular or square shape, so that it can be used as the light transmitting cap 14, and the protective film 18 is made to adhere onto one face of the light transmission window 16. This work process corresponds to the process shown in steps S1 and S2 in the flow chart of FIG. 3.

The light transmission window 16 is formed into a predetermined profile, the size and profile of which agree with those of the opening of the cavity of the package body 10. In an inner circumferential periphery of the cavity opening of the package body 10, there is provided a step portion 11a for positioning the light transmission window 16 so that the light transmission window 16 can be made to adhere to the package body 10. The size and profile of the light transmission window 16 are determined so that the light transmission window 16 can be accommodated in an inner region of the cavity surrounded by this step portion 11a. The depth of the step portion 11a is determined so that an outer face of the light transmission window 16 and an outer face of the package body 10 can be set on substantially the same face when the outer circumferential edge of the light transmission window 16 is made to adhere to the step portion 11a.

An object of the protective film 18, which is provided on one face of the light transmission window 16, is described as follows. The protective film 18 is provided for the object of preventing an outer face of the light transmission window 16 from being damaged and also preventing foreign matters from attaching to the outer face of the light transmission window 16 when the light transmission window 16 is picked up or when the optical device, in which the light transmission window 16 is assembled into a product, is transported. Also, the protective film 18 is provided for the object of protecting the optical element 12 such as an image sensor from the ultraviolet rays used in an adhesion process because the light transmitting cap 14 is made to adhere by using an ultraviolet-light-setting type adhesive in this embodiment. That is, this embodiment is characterized in that the protective film 18 is made of film material through which ultraviolet rays are not transmitted. The reason why the protective film 18 is made of film material through which ultraviolet rays are not transmitted is that the optical element 12 such as an image sensor is damaged when it is irradiated with ultraviolet rays, and it is necessary to prevent the optical element 12 from being irradiated with ultraviolet rays by shielding it with the protective film 18. In this connection, the material of the protective film 18 is not limited to a specific material. As long as it can prevent the transmission of ultraviolet rays, any material can be used. For example, a synthetic resin film made of polyethylene terephthalate can be used for the protective film 18.

Since the ultraviolet rays used in the adhesion process are not necessarily parallel rays, it is necessary to ensure a region in which the protective film 18 is provided so that the optical element can be surely located in a region shielded by the protective film 18.

On the other hand, the protective film 18 must be provided so that an adhesion portion formed between the outer circumferential periphery of the optical transmission window 16 and the package body 10 can be exposed to ultraviolet rays and cured. Accordingly, a portion of the light transmission window 16, which is made to adhere to the package body 10, that is, an outer circumferential periphery of the light transmission window 16 is not covered with the protective film 18.

In the structure shown in FIG. 1(b), the protective film is made to adhere in such a manner that a portion of the surface of the light transmission window 16 is exposed along the outer circumferential edge of the light transmission window 16. In this case, from the viewpoints of preventing the optical element 12 from being damaged and protecting the surface of the light transmission window 16, it is effective to cover the surface of the light transmission window 16 with the protective film 18 as widely as possible. Actually, the adhesion range of the protective film 18 is determined in relation to the coating range of the ultraviolet-light-setting type adhesive.

FIG. 1(b) is a view showing a state in which the light transmitting cap 14, in which the protective film 18 is made to adhere to the light transmission window 16, is fixed to the package body 10.

In this case, the package body 10 is previously formed into a predetermined profile by resin molding.

In the flow chart shown in FIG. 3, step S3 is a pre-mold process in which the lead frame is subjected to resin molding so that the package body 10 is formed. In this process, in which the lead frame is subjected to resin molding, usually, resin molding is conducted while a plurality of package bodies 10 are arranged in line in the frame section of the rectangular lead frame.

Step S4 is a process in which tie bars for connecting the adjoining outer leads so as to stop a flow of resin in the process of resin molding are cut off and removed. When the tie bars are cut in this way, the respective outer leads 20b become independent.

Step S5 is a process in which the optical element 12 is made to adhere to a mounting section of the package body 10, i.e. on the stage 13 of the lead frame 20. As shown in FIG. 1(b), the package body 10 is formed into a rectangular box, the upper face of which is opened to define a cavity having an opening, and an inner bottom face of a recess surrounded by the circumferential wall 11 becomes the mounting section in which the optical element 12 is mounted. Around the mounting section (stage 13) on which the optical element 12 is mounted, the inner leads 20a are arranged in such a manner that the inner leads 20a surround the mounting section (stage) 13. Each inner lead 20a penetrates the circumferential wall 11 of the package body 10 and connects with the outer lead 20b. The package of this embodiment is a quadrangle type product in which the outer leads 20b are extended outside from the respective wall faces of the package body 10.

The optical element 12 and the inner leads 20a are electrically connected with each other by wire bonding (step S6). Wire bonding of the optical element 12 with the inner leads 20a is conducted by a wire bonder.

As shown in FIG. 1(b), the optical element 12 is mounted on the stage 13 of the package body 10, and the inner leads 20a and the optical element 12 are connected with each other by wire bonding. After that, it proceeds to a process in which the light transmitting cap 14 is made to adhere to the package body 10.

In this embodiment, the light transmitting cap 14 is made to adhere to the package body 10 with the ultraviolet-light-setting type adhesive. In order to make the light transmitting cap 14 adhere to the package body 10, the ultraviolet-light-setting type adhesive is coated on the step portion 11a of the periphery of the opening of the package body 10. Specifically, the ultraviolet-light-setting type adhesive is coated on an inner face of the step portion 11a formed in the upper portion of the circumferential wall 11 of the package body 10 (step S7).

Next, the light transmitting cap 14 is attached to the opening of the package body 10 (step S8). In this case, the light transmitting cap 14 is attached to the opening of the package body 10 while a face of the light transmitting cap 14, on which the protective film 18 is made to adhere, is set outside with respect to the cavity. The operation of attaching the light transmitting cap 14 to the package body 10 can be automatically conducted with a mounting device by which the light transmitting cap 14, particularly the portion of the protective film 18, is pneumatically sucked by a suction pad and positioned to the opening of the package body 10.

Next, ultraviolet rays are irradiated from an upper portion of the light transmitting cap 14, so that the ultraviolet-light-setting type adhesive is cured (step S9).

FIG. 2 is a schematic illustration showing a state in which ultraviolet rays are irradiated from an upper portion of the package while the light transmitting cap 14 is attached to the package body 10, so that the light transmitting cap 14 is made to adhere to the package body 10.

As described before, the protective film 18 for preventing the transmission of ultraviolet rays is made to adhere onto the surface of the light transmission window 16 of the light transmitting cap 14. Since the protective film 18 is made to adhere to the light transmission window 16 so as to conduct shielding in such a manner that the optical element 12 mounted on the package body 10 can not be irradiated with ultraviolet rays, the optical element 12 can be safely protected even if ultraviolet rays are irradiated from an upper portion of the light transmission window 16.

On the other hand, the outer circumferential edge of the light transmission window 16 is not covered with the protective film 18 but the surface of the light transmission window 16 is exposed. Therefore, ultraviolet rays are transmitted only to a portion in which adhesive is coated. Therefore, the coated adhesive can be positively cured.

In the case of using an ultraviolet-light-setting type adhesive, the adhesive can be cured when it is irradiated with ultraviolet rays at the ordinary temperature. Therefore, it is unnecessary to heat a workpiece in a heating furnace. In order to cure an ultraviolet-light-setting type adhesive by irradiating it with ultraviolet rays, it is sufficient that the ultraviolet-light-setting type adhesive is irradiated with ultraviolet rays for only 30 minutes. Therefore, it is possible to greatly reduce a period of time necessary for curing the adhesive compared with the conventional method in which a thermosetting type adhesive is used.

Figure 4:
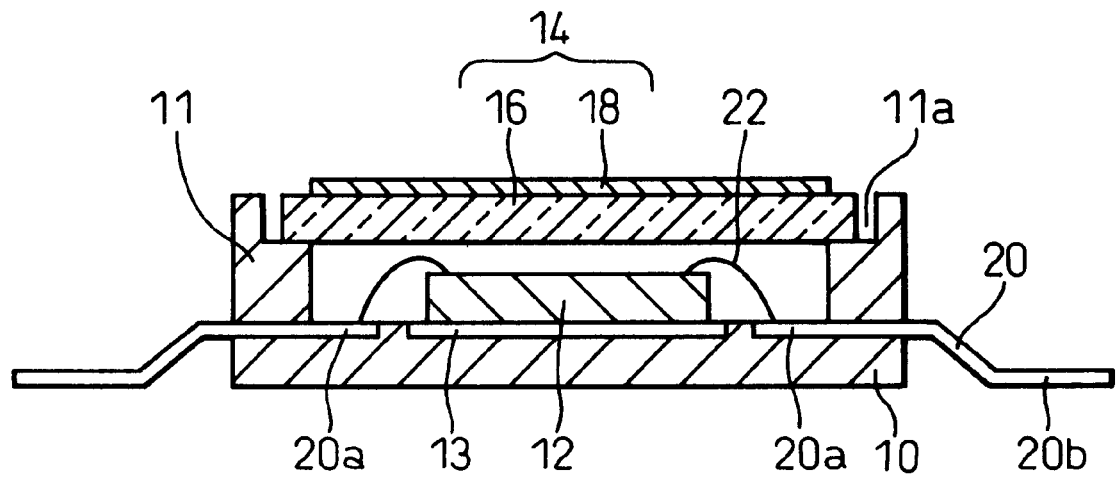
FIG. 4 is cross-sectional view showing a structure of an optical device of the present invention.

After the light transmitting cap 14 has been made to adhere to the package body 10, the outer leads 20b are bent to a predetermined profile in the trimming and forming process, and then the individual optical devices are separated from the lead frame. In this way, a single optical device is obtained (step S10). In this way, it is possible to obtain an optical device shown in FIG. 4 in which the optical element 12 is mounted on the package body 10 and the opening of the package body 10 is sealed by the light transmitting cap 14.

In the case of using the optical device, the protective film 18 is peeled off from a surface of the light transmission window 16. Since the surface of the light transmission window 16 is protected by the protective film 18, it is possible to prevent the surface of the light transmission window 16 from being damaged and also it is possible to prevent foreign matters from attaching onto the surface of the light transmission window 16. Therefore, it becomes possible to provide an optical device of high quality. In this case, it is preferable to use an appropriate adhesive so that no adhesive is left on the surface of the light transmission window 16 after the protective film 18 has been peeled off.

In the method of manufacturing the optical device of this embodiment, a light-setting type adhesive is used as adhesive to make the light transmitting cap 14 adhere to the package body 10 as described above. Therefore, in the adhesion process of the light transmitting cap 14, it is sufficient that the workpiece is irradiated with ultraviolet rays, and it is unnecessary for the workpiece to be heated. Accordingly, the adhesion process can be made very simple. Since the workpiece is not heated, there is no possibility that the light transmitting cap is raised from the package body by the pressure of gas emitted from adhesive in the process of heating. Due to the foregoing, it is unnecessary to use a clamp jig which is used in the conventional manufacturing process. Therefore, it becomes possible to omit the work of handling the clamp jig.

A period of time necessary for curing an ultraviolet-light-setting type adhesive by irradiating ultraviolet rays to it is approximately 30 minutes. Therefore, it is possible to greatly reduce the working time as compared with the conventional adhesion process in which a thermosetting type adhesive is used to make the light transmission type cap adhere to the package body.

According to a process for curing an adhesive by irradiating ultraviolet rays, it is unnecessary to use batch processing. For example, when a workpiece is irradiated with ultraviolet rays while the workpiece is being transported, it is possible to continuously cure adhesive. When the workpiece is continuously processed in this way, it easy to automate the adhesion process. Due to the foregoing, it is possible to reduce the manufacturing time and greatly enhance the manufacturing efficiency, and also it is possible to save labor for manufacturing optical devices.

In the above embodiment, the light transmitting cap 14 is used which is composed of a single body of the light transmission window 16. However, it should be noted that it is possible to somewhat enhance the manufacturing efficiency of the optical device by using an ultraviolet-light-setting type adhesive in the case of assembling an optical device such as shown in FIG. 5.

Figure 5:
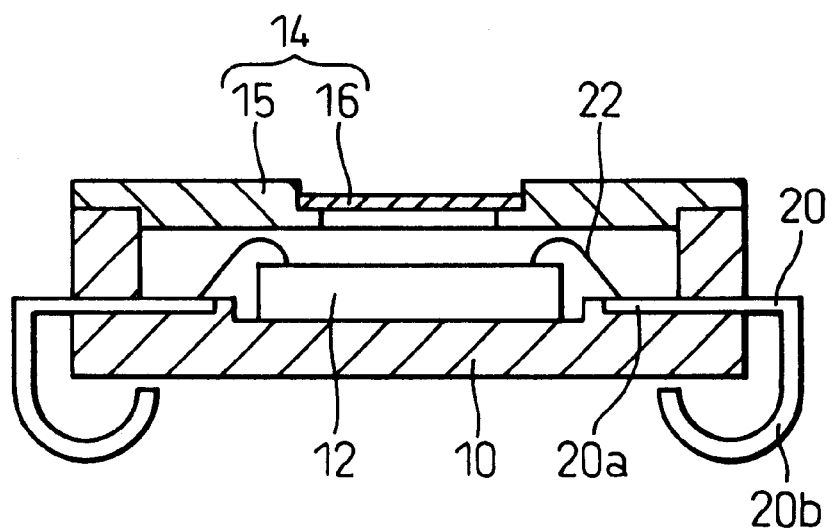
FIG. 5 is cross-sectional view showing a structure of an optical device conventionally known in the prior art.

That is, in the case where the light transmitting cap 14 in which the light transmission window 16 is attached to the frame 15 made by resin molding is used as shown in FIG. 5, the light transmitting cap 14 may be previously assembled by making the light transmission window 16 adhere to the frame 15. In the case where the light transmitting cap 14 is assembled in this way, it is conventional that the light transmission window 16 is made to adhere to the frame 15 with a thermosetting type adhesive because of the necessity of heat-resistance. Therefore, even in the case of assembling the light transmitting cap 14, the light transmitting cap 14 is accommodated in a heating furnace and heated for curing in a predetermined period of time.

For the above reasons, when the light transmitting cap 14 is assembled by the conventional method, it takes a long time. However, when an ultraviolet-light-setting type adhesive is used as adhesive for making the light transmission window 16 adhere to the frame 15 in the same manner as that of the above embodiment, it becomes unnecessary to heat a workpiece when the light transmitting cap 14 is assembled, and the light transmission window 16 can be simply made to adhere to the frame 15 only by irradiating ultraviolet rays. Therefore, it is possible to reduce the assembling time of the light transmitting cap 14, and it becomes possible to mass-produce the light transmitting cap 14 easily.

According to the optical device and a process for manufacturing it of the present invention, as described above, it is possible to simplify the process of making the light transmitting cap adhere to the package body, and it is also possible to efficiently conduct the process of making the light transmitting cap adhere to the package body. Further, it is possible to efficiently conduct the entire process of manufacturing the optical device. Furthermore, the manufacturing apparatus can be automated. Therefore, the manufacturing efficiency can be enhanced and labor for manufacturing the optical device can be effectively saved.

It should be understood by those skilled in the art that the foregoing description relates to only a preferred embodiment of the disclosed invention, and that various changes and modifications may be made to the invention without departing the sprit and scope thereof.

What is claimed is:

1. A process for manufacturing an optical device comprising the following steps of:

preparing a package consisting of a lead frame and a molded resin integrally molded with said lead frame, said package being provided with a cavity having an opening;

installing an optical element in said cavity of the package;

coating an ultraviolet-light-setting type adhesive along a periphery of said opening of the package;

applying a cap for defining a light transmission window to said package, said cap being provided with a light permeable protective film attached to one surface of said cap, so that said opening of the cavity is closed in such a manner that said light permeable protective film faces outside of the cavity;

irradiating a ultraviolet-light toward an adhesion area between said cap and said package, through said cap except for an area to which said light permeable protective film is attached, to solidify said ultraviolet-light-setting type adhesive to fix said cap to said package; and removing said light permeable protective film from said cap after said cap is fixed to said package.

2. A process as set forth in claim 1, wherein said UV light impermeable, protective film is attached in advance to said one surface of the cap except for an outer peripheral area of the cap, which is exposed from said protective film.

3. A process for manufacturing an optical device comprising the following steps of:

preparing a package consisting of a lead frame and a molded resin integrally molded with said lead frame, said package being provided with a cavity having an opening, said lead frame comprising a stage exposed on a bottom surface of said cavity and a plurality of leads, each lead having an inner lead exposed on said bottom surface of the cavity and arranged around said stage and an outer lead extending outward from said molded resin of the package; and installing said optical element in said cavity so that said optical element is mounted on said stage; and electrically connecting said optical element to said inner leads, before said cap is applied to the package;

coating an ultraviolet-light-setting type adhesive along a periphery of said opening of the package;

applying a cap for defining a light transmission window to said package so as to close said opening of the cavity; and irradiating a ultraviolet-light toward an adhesion area between said cap and said package to solidify said ultraviolet-light-setting type adhesive to fix said cap to said package.

* * * * *